United States Patent
Chen et al.

(10) Patent No.: US 10,847,525 B2
(45) Date of Patent: Nov. 24, 2020

(54) METHOD FOR MANUFACTURING NON-VOLATILE MEMORY DEVICE

(71) Applicant: Winbond Electronics Corp., Taichung (TW)

(72) Inventors: Yi-Chung Chen, Taichung (TW); Cheng-Jen Lai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/590,673

(22) Filed: Oct. 2, 2019

(65) Prior Publication Data
US 2020/0105776 A1    Apr. 2, 2020

(30) Foreign Application Priority Data
Oct. 2, 2018   (TW) ............... 107134800 A

(51) Int. Cl.
*H01L 21/461*   (2006.01)
*H01L 27/11521*   (2017.01)

(52) U.S. Cl.
CPC ............... *H01L 27/11521* (2013.01)

(58) Field of Classification Search
None
See application file for complete search history.

(56) References Cited

U.S. PATENT DOCUMENTS

| | | |
|---|---|---|
| 6,350,693 B2 | 2/2002 | Chang et al. |
| 6,383,935 B1 | 5/2002 | Lin et al. |
| 6,551,922 B1 | 4/2003 | Grant et al. |
| 7,018,924 B2 | 3/2006 | Jung et al. |
| 8,288,280 B2 | 10/2012 | Hung et al. |
| 9,997,562 B1 * | 6/2018 | Wang ............ H01L 43/12 |
| 2009/0023289 A1 * | 1/2009 | Hung ............ H01L 21/3212 438/691 |
| 2011/0275216 A1 * | 11/2011 | Chen ............ H01L 21/7684 438/693 |
| 2016/0104623 A1 * | 4/2016 | Wang ............ H01L 21/32115 257/315 |
| 2017/0162432 A1 * | 6/2017 | Nien ............ H01L 21/82343 |

FOREIGN PATENT DOCUMENTS

| | | |
|---|---|---|
| JP | 5542293 B2 | 7/2014 |
| KR | 20020050762 A | 6/2002 |
| TW | 201428896 A | 7/2014 |

* cited by examiner

*Primary Examiner* — Ali Naraghi
(74) *Attorney, Agent, or Firm* — Muncy, Geissler, Olds & Lowe, P.C.

(57) ABSTRACT

A method for manufacturing a non-volatile memory device is provided. The method includes the following steps. A plurality of isolation structures are formed in a substrate, and a depression region is formed between two adjacent isolation structures. A conductive layer and a sacrificial layer are conformally formed on the isolation structures and the substrate. The sacrificial layer in the depression region defines a recess part. A first CMP process is performed to partially remove the sacrificial layer and to expose the conductive layer on the isolation structures. A second CMP process is performed to partially remove conductive layer, and to expose top surfaces of the isolation structures. A third CMP process is performed to remove the sacrificial layer completely. A top surface of the conductive layer is level with a top surface of the isolation structure after the third CMP process.

12 Claims, 5 Drawing Sheets

METHOD FOR MANUFACTURING NON-VOLATILE MEMORY DEVICE

CROSS REFERENCE TO RELATED APPLICATIONS

This Application claims priority of Taiwan Patent Application No. 107134800, filed on Oct. 2, 2018, the entirety of which is incorporated by reference herein.

BACKGROUND

Field of the Disclosure

The present disclosure relates to a method for manufacturing a non-volatile memory device, and in particular it relates to a method which includes a chemical mechanical polishing process for manufacturing a non-volatile memory device.

Description of the Related Art

Among all non-volatile memories, flash memory has become a mainstream for non-volatile memory due to its low cost. In the manufacture of flash memory, a chemical mechanical polishing (CMP) process is often used for planarization. For example, the step of forming the floating gate and/or the control gate includes using the CMP process to planarize the conductive material. However, due to the difference in size (or spacing) of these floating gates (or control gates), producing the floating gate (or control gate) by the CMP process is prone to having defects. More specifically, with a conductive material having a large area (for example, an area greater than 0.5 μm*0.5 μmm), the polishing rate of the central region is generally greater than the polishing rate of the edge region. Therefore, dishing is easily generated in the central region, and the yield of the memory device may be reduced. On the other hand, for the conductive materials having different areas, the depth and size of the resulting dishing may also be different and difficult to be predicted. Therefore, if the dishing is generated, the reliability of the memory device may also be reduced.

In the prior art, in order to prevent the occurrence of dishing, the conductive material having a large area is usually protected by a mask layer. However, in order to form a mask layer in a specific region, at least one additional mask is required for the lithography process. On the other hand, in order to protect the conductive materials that have different areas, the mask layer must be adjusted to an appropriate size, in accordance with the area of the respective conductive material. As a result, the complexity and difficulty of the patterning process will be greatly increased, and the time and cost of production will be significantly increased.

However, in the prior art, when the conductive material has a high pattern complexity, the mask layer usually covers only the conductive material having a large area, and the dishing may still occur in other conductive materials that are not covered by the mask layer. As a result, it will be difficult to improve the yield and reliability of the memory device.

Therefore, there is still a need in the art for method of manufacturing a non-volatile memory device which has high reliability and high product yield.

BRIEF SUMMARY

The present invention provides a method for manufacturing a non-volatile memory device, and the method can reduce or prevent the occurrence of dishing.

The disclosure provides a method for manufacturing a non-volatile memory device. The method includes forming a plurality of isolation structures in a substrate. The isolation structures protrude from a top surface of the substrate and a depression region is formed between two adjacent isolation structures. The method also includes conformally forming a conductive layer on the isolation structures and the substrate and conformally forming a sacrificial layer on the conductive layer. The sacrificial layer located in the depression region defines a recess part. The method also includes performing a first chemical mechanical polishing process to partially remove the sacrificial layer and to expose the conductive layer on the isolation structures; performing a second chemical mechanical polishing process to partially remove the conductive layer and to expose top surfaces of the isolation structures; and performing a third chemical mechanical polishing process to completely remove the sacrificial layer. A top surface of the conductive layer is level with the top surfaces of the isolation structures.

The manufacturing method of the non-volatile memory device provided by the embodiments of the present invention can improve the yield and reliability of the non-volatile memory device, and can reduce the amount of the masks and the developing processes. Therefore, a simplified manufacturing process is provided, and the time and cost of production will be significantly reduced.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
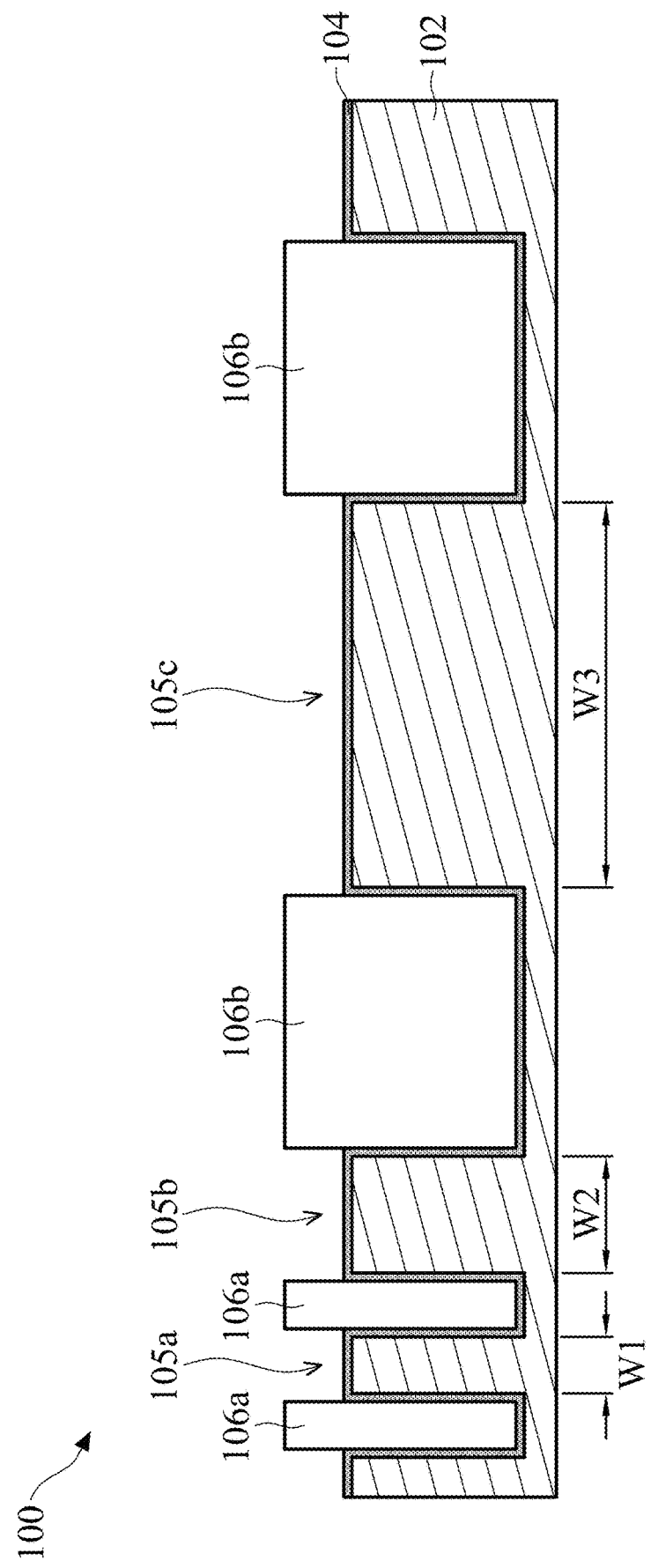
FIGS. 1A-1E are cross-sectional views corresponding to various steps of manufacturing a non-volatile memory device in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

A method for manufacturing a non-volatile memory device is provided in the present disclosure. FIGS. 1A-1E are cross-sectional views corresponding to various steps of manufacturing a non-volatile memory device 100 in accordance with some embodiments.

Referring to FIG. 1A, an oxide layer 104 is formed on the surface of a substrate 102, and a plurality of isolation structures 106a, 106b are formed in the substrate 102. The top surfaces of the isolation structures 106a, 106b protrude from the top surface of the substrate 102. In detail, the oxide layer 104 may be formed by performing a thermal oxidation process on the surface of the substrate 102. Then, a mask layer (not shown) is formed over the substrate 102, and the mask layer and the substrate 102 are patterned to form a plurality of trenches in the substrate 102. The thermal oxidation process may be performed again as needed to form the oxide layer 104 on the surfaces of the plurality of trenches. Then, an insulating material is formed and filled into the plurality of trenches. The insulating material may include an oxide, a nitride, an oxynitride or a combination thereof. Then, a planarization process (for example, a CMP process) is performed to make the top surface of the mask layer and the top surfaces of the insulating material be level with one another. Then, the mask layer is removed and the isolation structures 106a, 106b formed of the insulating material are left.

In some embodiments, the substrate 102 may be a semiconductor substrate. In some embodiments, the material of the substrate 102 may include silicon, gallium arsenide, gallium nitride, silicon germanium, silicon on insulator (SOI), another suitable material, or a combination thereof. In some embodiments, other structures (for example, doped regions) may be included in the substrate 102. In this embodiment, the substrate 102 is a silicon substrate.

The dimensions (length or width) of the isolation structure 106b may be greater than those of the isolation structure 106a. The isolation structures 106a, 106b may be a single layer structure or a multilayer structure. In this embodiment, the isolation structures 106a, 106b is a single layer structure formed of an oxide. In other embodiments, in order to improve the adhesion between the isolation structures 106a, 106b and the substrate 102, an insulating liner may be optionally formed between the isolation structures 106a, 106b and the substrate 102.

Referring to FIG. 1A, after removing the mask layer, a plurality of depression regions are formed, and each depression region is located between two adjacent isolation structures. These depression regions may include the depression region 105a, the depression region 105b, and the depression regions 105c, all of which are different sizes. In the present embodiment, the depression region 105a is located between two adjacent isolation structures 106a, and the depression region 105a has a first width W1. The depression region 105b is located between an isolation structure 106a and the adjacent isolation structure 106b, and the depression region 105b has a second width W2. The depression region 105c is located between two adjacent isolation structures 106b, and the depression region 105c has a third width W3. Furthermore, in the present embodiment, the third width W3 is greater than the second width W2, and the second width W2 is greater than the first width W1.

It should be noted that the isolation structures having two widths and the depression regions having three widths are illustrated in FIG. 1A. However, FIG. 1A is merely for illustrative purposes and is not intended to limit the present invention. Furthermore, depending on the actual requirements, the isolation structures and the depression regions may also include other different arrangements.

Figure 1B:
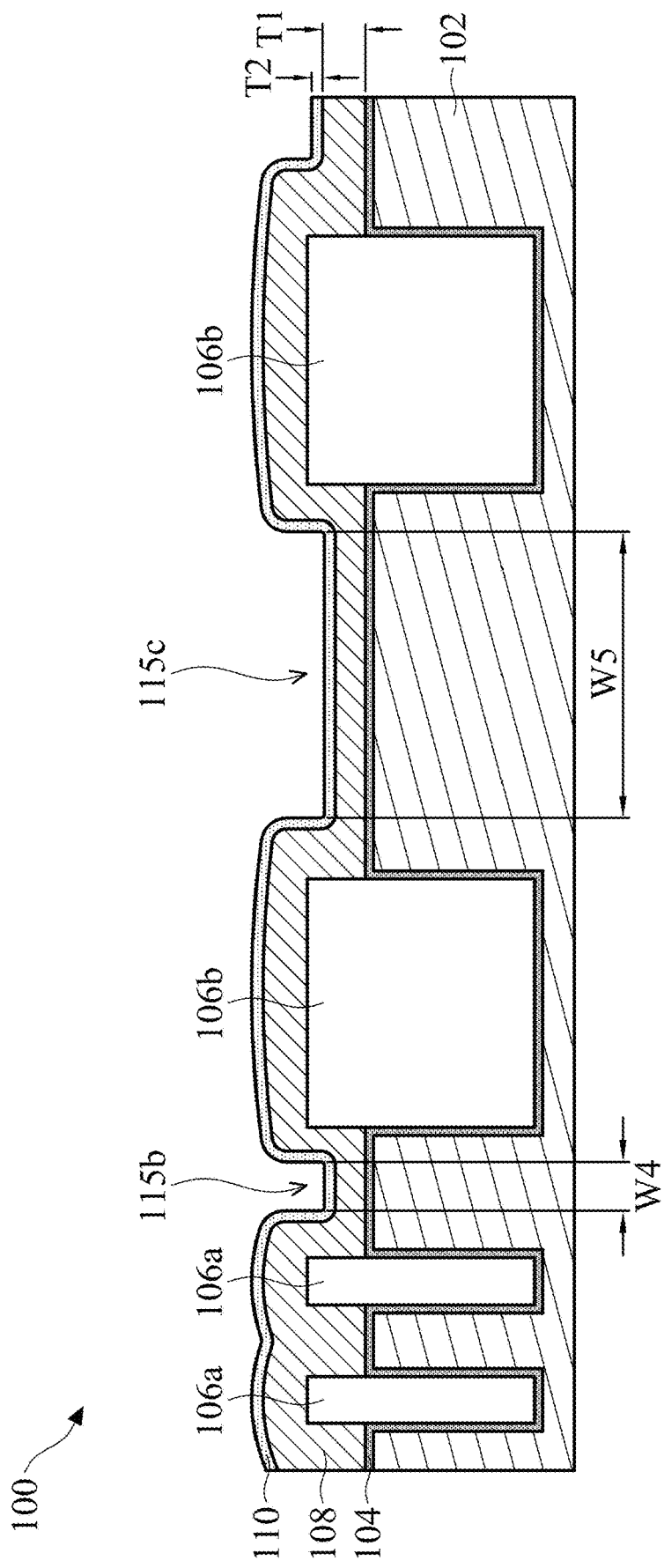

Referring to FIG. 1B, the conductive layer 108 is conformally formed on the isolation structures 106a, 106b and the substrate 102. The conductive layer 108 can be used as a floating gate or another conductive structure (for example, a conductive wire) after the subsequent process is completed. The conductive layer 108 may include monocrystalline silicon, polycrystalline silicon, amorphous silicon, or another suitable conductive material. In this embodiment, the material of the conductive layer 108 is polycrystalline silicon. The conductive layer 108 may be formed by a deposition process, for example, a furnace process, a chemical vapor deposition process, an atomic layer deposition process, or a combination thereof.

Referring to FIG. 1B, the sacrificial layer 110 is conformally formed on the conductive layer 108. The material of the sacrificial layer 110 may include an oxide, a nitride, an oxynitride, another suitable material, or a combination thereof. In some embodiments, the material of the sacrificial layer is the same as the material of the isolation structure. In other embodiments, the isolation structure is a multilayer structure, and the material of the sacrificial layer is the same as the material of the uppermost layer of the isolation structure. In this embodiment, the material of the sacrificial layer 110 is an oxide. The sacrificial layer 110 may be formed by a deposition process, for example, a furnace process, a chemical vapor deposition process, an atomic layer deposition process, or a combination thereof.

The cross-sectional profiles of the conductive layer 108 and the sacrificial layer 110 located in these depression regions are different from one another due to the loading effect. Referring to FIG. 1B, the conductive layer 108 may completely fill the depression region 105a, and thus the top surface of the sacrificial layer 110 at the corresponding depression region 105a is higher than the top surface of the isolation structure 106a adjacent to the depression region 105a. On the other hand, the conductive layer 108 and the sacrificial layer 110 do not completely fill the depression region 105b, and a recess part 115b is formed at the position corresponding to the depression region 105b. Furthermore, the conductive layer 108 and sacrificial layer 110 do not completely fill the depression region 105c, and a recess part 115c is formed at the position corresponding to the depression region 105c. In this embodiment, the recess part 115b has a fourth width W4. The recess part 115c has a fifth width W5 that is greater than the fourth width W4.

Figure 1C:
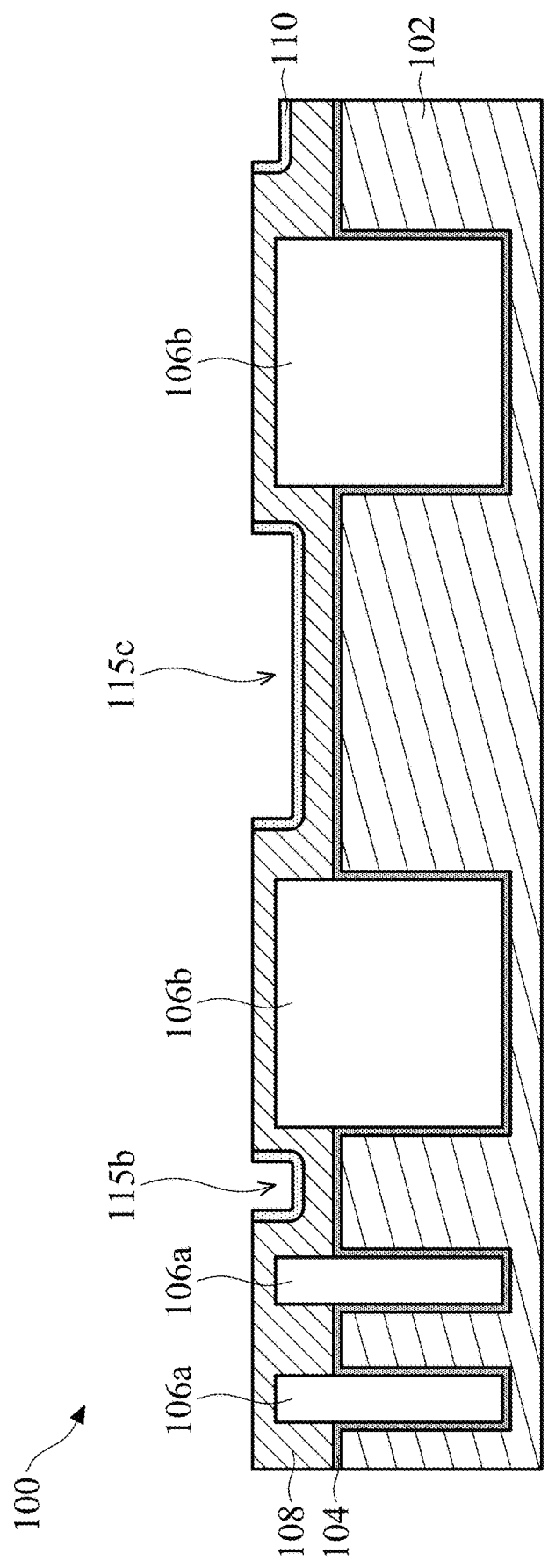

Referring to FIG. 1C, a first CMP process is performed to partially remove the sacrificial layer 110 and to expose the conductive layer 108 directly over the isolation structures 106a, 106b. After the first CMP process is completed, each of the remaining sacrificial layers 110 has a U-shaped cross-sectional profile. During the first CMP process, the polishing rate (or removal rate) R1a of the conductive layer 108 may be the same as or similar to the polishing rate R1b of the sacrificial layers 110. In some embodiments, during the first CMP process, the ratio (R1a/R1b) of the polishing rate R1a of the conductive layer 108 to the polishing rate R1b of the sacrificial layer 110 is 0.1-10.0. As a result, the conductive layer 108 and the sacrificial layer 110 can be simultaneously removed in a single CMP process, and the top surface of the exposed conductive layer 108 can be relatively flat.

In order to control the ratio (R1a/R1b) of the polishing rate of the conductive layer 108 to the polishing rate of the sacrificial layer 110 within the aforementioned range, the first CMP process may be performed by using a suitable polishing slurry. In some embodiments, a first polishing slurry is used in the first CMP process, and the first polishing slurry is acidic.

Figure 1D:
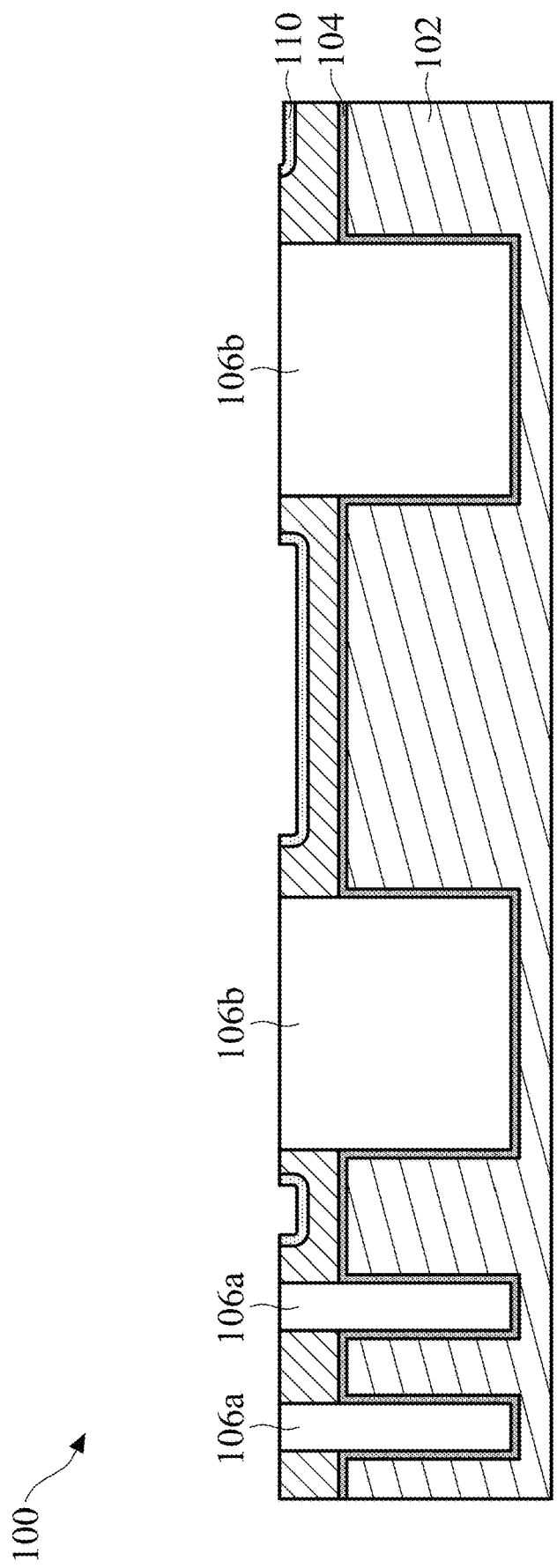

Referring to FIG. 1D, a second CMP process is performed to partially remove the exposed conductive layer 108 and the sacrificial layer 110 until the top surface of the isolation structures 106a, 106b is exposed. After the second CMP process, the remaining sacrificial layer 110 still covers a portion of the conductive layer 108.

The polishing rate R2a of the conductive layer 108 in the second CMP process may be much greater than the polishing rate R1a of the conductive layer 108 in the first CMP process. As a result, the conductive layer 108 can be removed with higher efficiency, and the time of the second CMP process is significantly shortened. On the other hand, the polishing rate R2a of the conductive layer 108 in the second CMP process may be much greater than the polishing rate R2b of the sacrificial layer 110 in the second CMP process. As a result, during the second CMP process, the conductive layer 108 underlying the recess parts 115b, 115c can be protected from being removed by the sacrificial layer 110.

In some embodiments, during the second CMP process, the ratio (R2a/R2b) of the polishing rate R2a of the conductive layer 108 to the polishing rate R2b of the sacrificial layer 110 is 50-1000. In still other embodiments, during the second CMP process, the ratio (R2a/R2b) of the polishing rate R2a of the conductive layer 108 to the polishing rate R2b of the sacrificial layer 110 is 200-600.

In order to control the ratio (R2a/R2b) of the polishing rate R2a of the conductive layer 108 to the polishing rate R2b of the sacrificial layer 110 within the aforementioned range, the second CMP process may be performed by using a suitable polishing slurry. A second polishing slurry is used in the second CMP process, and the second polishing slurry is basic. In this embodiment, the material of the conductive layer 108 is polycrystalline silicon.

Figure 1E:
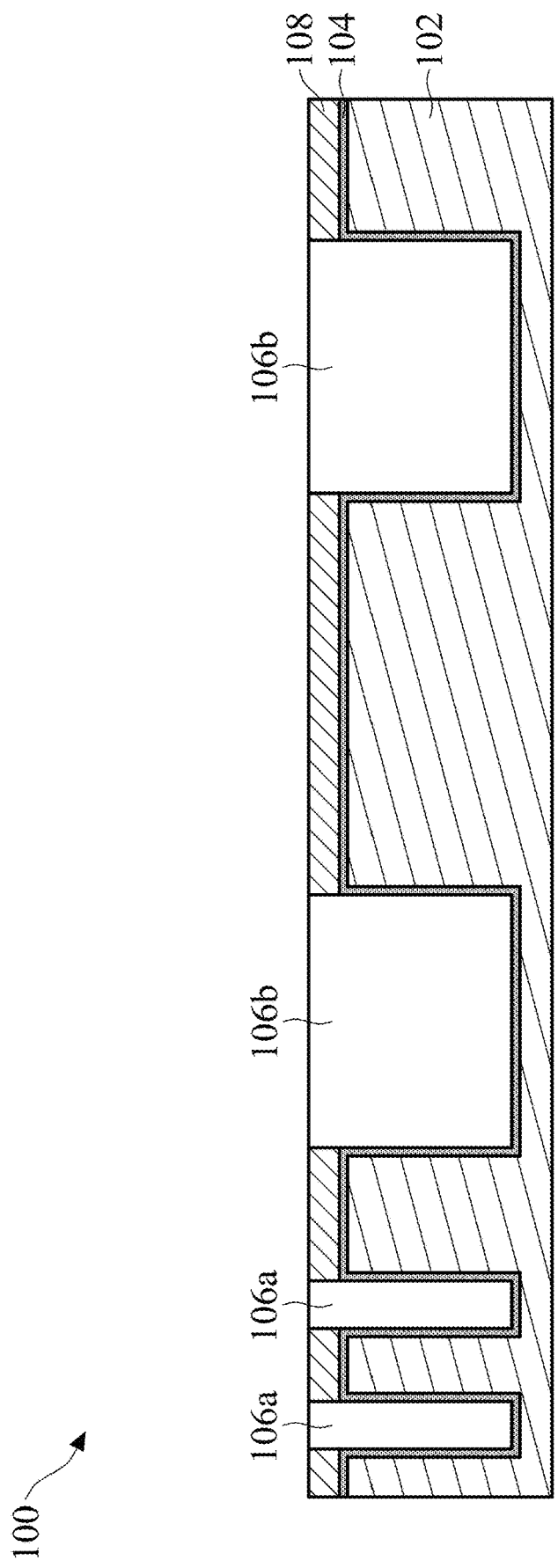

Then, referring to FIG. 1E, a third CMP process is performed to partially remove the exposed conductive layer 108, the isolation structures 106a, 106b and to completely remove the sacrificial layer 110. Therefore, the top surface of the conductive layer 108 is level with the top surfaces of the isolation structures 106a, 106b.

During the third CMP process, the polishing rate R3a of the conductive layer 108, the polishing rate R3b of the sacrificial layer 110, and the polishing rate R3c of the isolation structures 106a, 106b may be the same as or similar to one another. In some embodiments, during the third CMP process, the ratio (R3a/R3b) of the polishing rate R3a of the conductive layer 108 to the polishing rate R3b of the sacrificial layer 110 is 1.0-1.1. As a result, it is advantageous to make the top surface of the conductive layer 108 substantially be level with the top surfaces of the isolation structures 106a, 106b, and to reduce or prevent the occurrence of dishing on the top surfaces of the conductive layer 108 and the isolation structures 106a, 106b.

In order to control the ratio (R3a/R3b) of the polishing rate R3a of the conductive layer 108 to the polishing rate R3b of the sacrificial layer 110 within the aforementioned range, the third CMP process may be performed by using a suitable polishing slurry. A third polishing slurry is used in the third CMP process, and the third polishing slurry is acidic. In this embodiment, the material of the conductive layer 108 is polycrystalline silicon, the polishing rate R3a of the conductive layer 108 in the third CMP process may be much smaller than the polishing rate R2a of the conductive layer 108 in the second CMP process.

After the third CMP process is completed, the conductive layer 108 is divided into a plurality of separate portions, as shown in FIG. 1E. In some embodiments, in order to reduce the electrical resistance value of the conductive layer 108, an implantation process and an annealing process may be performed to the conductive layer 108. A portion of the conductive layer 108 may be used as floating gates. Other conventional processes (for example, forming and patterning control gates) may be performed to complete the non-volatile memory device 100. These conventional processes are not described in detail herein.

In accordance with the method of manufacturing a non-volatile memory device provided in some embodiments of the present invention, the conductive layer 108 conformally covers the isolation structures 106a, 106b and the substrate 102, and the sacrificial layer 110 conformally covers the conductive layer 108 to define the recess part (for example, the recess parts 115b, 115c) between two adjacent isolation structures. According to the load effect, the greater the distance between the isolation structures, the more difficult it is for the conductive layer 108 and the sacrificial layer 110 to fill the depression regions between the isolation structures, thereby making it easier to form the recess parts. After the first CMP process is completed, the sacrificial layer 110 defining the recess parts still remains over the conductive layer 108 having a larger area. In other words, the sacrificial layer 110 can be self-aligned and formed over the conductive layer 108. As a result, during the second CMP process, the sacrificial layer 110 can protect the underlying conductive layer 108 from being removed.

It should be understood that in the manufacturing method of this embodiment, no patterning process is performed after the formation of the conductive layer 108 and before the third CMP process is stopped. Compared with the prior art, the manufacturing method of this embodiment can omit at least one mask and one lithography process. Therefore, the complexity of the process and the time and cost of production can be greatly reduced.

In the manufacturing method of this embodiment, three CMP processes are performed. The first CMP process has a first polishing selectivity for the conductive layer 108 and the sacrificial layer 110; the second CMP process has a second polishing selectivity for the conductive layer 108 and the sacrificial layer 110; and the third CMP process has a third polishing selectivity for the conductive layer 108 and the sacrificial layer 110. The first polishing selectivity is different from the second polishing selectivity, and the second polishing selectivity is different from the third polishing selectivity. More specifically, the second polishing selectivity is much greater than the first polishing selectivity and the third polishing selectivity. In other words, in the second CMP process, the polishing rate R2a of the conductive layer 108 is much larger than the polishing rate R2b of the sacrificial layer 110. Therefore, during the second CMP process, the sacrificial layer 110 can protect the underlying conductive layer 108 from being removed, thereby reducing or preventing the occurrence of dishing in these regions.

It should be understood that the manufacturing method of this embodiment can control not only the positions of the recess parts but also the widths of the recess parts. Referring to FIGS. 1A and 1B, in this embodiment, the conductive layer 108 has a first thickness T1, and the sacrificial layer 110 has a second thickness T2. Furthermore, the ratio [W2/(T1+T2)] of the width W2 of the depression region 105b to the sum (T1+T2) of the first thickness T1 of the conductive layer 108 and the second thickness T2 of the sacrificial layer 110 is greater than 2, and the ratio [W3/(T1+T2)] of the width W3 of the depression region 105c to the sum (T1+T2) of the first thickness T1 of the conductive layer 108 and the second thickness T2 of the sacrificial layer 110 is greater than 2. Therefore, the recess part 115b can be formed at the position corresponding to the depression portion 105b, and the recess part 115c can be formed at the position corresponding to the depression portion 105c. In addition, the larger the width of the depression region, the larger the width of the corresponding recess part, as shown in FIG. 1B.

In accordance with the manufacturing method of this embodiment, even though the conductive layer 108 may have a variety of sizes and shapes (i.e., the pattern complexity is high), the sacrificial layer 110 can be formed at the desired positions simply and accurately. Furthermore, in accordance with this embodiment, even if the developing process is not performed, the sacrificial layer 110, which has a variety of possible sizes and shapes, can be formed. Therefore, the yield of the non-volatile memory device can be significantly improved, and the time and cost of production can be reduced.

In this embodiment, during the second CMP process, the polishing rate of the conductive layer 108 is much greater than the polishing rates of the sacrificial layer 110 and the isolation structures 106a, 106b. Therefore, when an oxide region having a larger area (for example, the top surfaces of the isolation structures 106a, 106b or the sacrificial layer 110 at the bottom of the recess parts 115b, 115c) is exposed, the polishing rate of the second CMP process is significantly reduced. The frictional force between the wafer and the polishing pad is significantly changed, and the sharp change of the corresponding current will occur. In one embodiment, during the second CMP process, the change in the current is detected, and the second CMP process is stopped when the change in the current is greater than a predetermined value. In conventional CMP process, the etched thickness is typically controlled by adjusting the polishing duration. However, when polishing wafers having different thicknesses, it is necessary to respectively adjust the appropriate polishing duration depending on the thicknesses of the wafers. Furthermore, when the same wafer includes isolation structures having different thicknesses, it is difficult to uniformly polish all areas of the wafer by adjusting the polishing duration. Compared with the conventional CMP process, even if the wafers having different thicknesses are polished, or the same wafer including the isolation structures having different thicknesses is polished, the method of this embodiment can precisely control the state of the polishing, and it is advantageous for obtaining the desired structure.

In this embodiment, before performing the first CMP process, the top surface of the sacrificial layers 110 at the bottom of the recess parts 115b, 115c are lower than the top surfaces of the isolation structures 106a, 106b, as shown in FIG. 1B. In other words, the height of the isolation structure 106a (or 106b) from the top surface of the substrate 102 is greater than the sum (T1+T2) of the first thickness T1 of the conductive layer 108 and the second thickness T2 of the sacrificial layer 110. Before the second CMP process is stopped, the sacrificial layers 110 at the bottom of the recess parts 115b, 115c are hardly removed. As a result, the sacrificial layer 110 can protect the conductive layer 108 well during the second CMP process.

In other embodiments, before performing the first CMP process, the top surfaces of the sacrificial layers 110 at the bottom of the recess parts 115b, 115c are level with the top surfaces of the isolation structures 106a, 106b. In such an embodiment, the top surfaces of the isolation structures 106a, 106b and the top surfaces of the sacrificial layers 110 at the bottom of the recess parts 115b, 115c will be exposed simultaneously. Therefore, the degree of reduction in the polishing rate will be greater, which is more advantageous in determining the termination point of the second CMP process.

In order to well protect the conductive layer 108 during the second CMP process, the thickness of the sacrificial layer 110 may be greater than a specific value. On the other hand, in order to shorten the duration of the third CMP process and to increase the production efficiency, the thickness of the sacrificial layer 110 may be smaller than another specific value. In some embodiments, the sacrificial layer 110 has a thickness in a range of 2-40 nm. In other embodiments, the sacrificial layer 110 has a thickness in a range of 5-25 nm. In some embodiments, the sacrificial layer 110 has a thickness in a range of 10-15 nm.

In addition, during the second CMP process, if the thickness of the sacrificial layer 110 is small, the area of the conductive layer 108 may be much larger than the area of the sacrificial layer 110 in the top view. During the second CMP process, even if the polishing rate R2b of the sacrificial layer 110 is small, the sacrificial layers 110 on the inner sidewalls of the recess parts 115b, 115c still can be easily removed by mechanical stress. As a result, the time required for the second CMP process is not increased, and the production efficiency can be improved.

As described above, the method for manufacturing the non-volatile memory device provided by the embodiments of the present invention can reduce or prevent the occurrence of dishing. Therefore, the yield and reliability of the resulted memory device can be significantly improved. Furthermore, the manufacturing method provided by the embodiments of the present invention can reduce the amount of the masks and the developing processes. Therefore, the process can be greatly simplified and the time and cost of production can be significantly reduced.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a non-volatile memory device, comprising:
   forming a plurality of isolation structures in a substrate, wherein the isolation structures protrude from a top surface of the substrate and a depression region is formed between two adjacent isolation structures;
   conformally forming a conductive layer on the isolation structures and the substrate;
   conformally forming a sacrificial layer on the conductive layer, wherein the sacrificial layer located in the depression region defines a recess part;
   performing a first CMP process to partially remove the sacrificial layer and to expose the conductive layer on the isolation structures;
   performing a second CMP process to partially remove the conductive layer and to expose top surfaces of the isolation structures; and
   performing a third CMP process to completely remove the sacrificial layer, wherein a top surface of the conductive layer is level with the top surfaces of the isolation structures.

2. The method for manufacturing the non-volatile memory device as claimed in claim 1, wherein the first CMP process has a first polishing selectivity for the conductive layer and the sacrificial layer, the second CMP process has a second polishing selectivity for the conductive layer and the sacrificial layer, and the first polishing selectivity is different from the second polishing selectivity.

3. The method for manufacturing the non-volatile memory device as claimed in claim 1, wherein the second CMP process has a second polishing selectivity for the conductive layer and the sacrificial layer, the third CMP process has a third polishing selectivity for the conductive layer and the sacrificial layer, and the second polishing selectivity is different from the third polishing selectivity.

4. The method for manufacturing the non-volatile memory device as claimed in claim 1, wherein during the third CMP process, a ratio of a polishing rate of the conductive layer to a polishing rate of the sacrificial layer is 1.0-1.1.

5. The method for manufacturing the non-volatile memory device as claimed in claim 1, wherein during the second CMP process, a ratio of a polishing rate of the conductive layer to a polishing rate of the sacrificial layer is 50-1000.

6. The method for manufacturing the non-volatile memory device as claimed in claim 1, wherein during the first CMP process, a ratio of a polishing rate of the conductive layer to a polishing rate of the sacrificial layer is 0.1-10.0.

7. The method for manufacturing the non-volatile memory device as claimed in claim 1, wherein the sacrificial layer has a U-shaped cross-sectional profile after performing the second CMP process.

8. The method for manufacturing the non-volatile memory device as claimed in claim 1, wherein the sacrificial layer has a thickness in a range of 2-40 nm.

9. The method for manufacturing the non-volatile memory device as claimed in claim 1, wherein no patterning process is performed after forming the conductive layer and before stopping the third CMP process.

10. The method for manufacturing the non-volatile memory device as claimed in claim 1, wherein a ratio of a width of the depression region to a sum of a first thickness of the conductive layer and a second thickness of the sacrificial layer is greater than 2.

11. The method for manufacturing the non-volatile memory device as claimed in claim 1, wherein:
 a first polishing slurry is used in the first CMP process, and the first polishing slurry is acidic;
 a second polishing slurry is used in the second CMP process, and the second polishing slurry is basic; and
 a third polishing slurry is used in the third CMP process, and the third polishing slurry is acidic.

12. The method for manufacturing the non-volatile memory device as claimed in claim 1, further comprising:
 detecting a change in a current during the second CMP process;
 stopping the second CMP process when the change in the current is greater than a predetermined value.

* * * * *